United States Patent [19]

Chan et al.

[11] 4,355,262

[45] Oct. 19, 1982

[54] ELECTRIC ARC APPARATUS

[76] Inventors: Anthony K. F. Chan, 22a Brondesbury Rd., London NW6, England; John C. Hilliard, Apt. 1119 Metro Towers, 26450 Crocker, Mount Clemens, Mich. 48043; Alan R. Jones, 4 Fairholme Rd., Ashford, Middlesex; Felix J. Weinberg, 59 Vicarage Rd., London SW14, both of England

[21] Appl. No.: 154,394

[22] PCT Filed: Dec. 19, 1978

[86] PCT No.: PCT/GB78/00054
§ 371 Date: Aug. 13, 1979
§ 102(e) Date: Aug. 13, 1979

[87] PCT Pub. No.: WO79/00413
PCT Pub. Date: Jul. 12, 1979

[30] Foreign Application Priority Data

Dec. 20, 1977 [GB] United Kingdom ............... 52925/77
Sep. 28, 1978 [GB] United Kingdom ............... 38578/78

[51] Int. Cl.³ ............................................ H01J 17/26
[52] U.S. Cl. ............................ 315/111.11; 219/123; 313/231.51; 315/111.41
[58] Field of Search ............... 315/111.1, 111.2, 111.4; 313/231.3, 231.4, 231.5; 219/121 PM, 121 PR, 123

[56] References Cited

U.S. PATENT DOCUMENTS

| 2,972,696 | 2/1961 | Kantrowitz et al. | 315/111.2 |
| 3,361,927 | 1/1968 | Buhler | 315/111 |
| 3,594,609 | 7/1971 | Vas | 315/111 |
| 3,940,641 | 2/1976 | Dooley | 219/121 PR |

FOREIGN PATENT DOCUMENTS

| 1189068 | 11/1965 | Fed. Rep. of Germany |
| 955702 | 4/1964 | United Kingdom |
| 995152 | 6/1965 | United Kingdom |
| 1114809 | 5/1968 | United Kingdom |

OTHER PUBLICATIONS

The Development and Characteristics of an Arc Heater with Hydrogen as the Plasma Working Fluid by Bunting, pp. 138-140, 2nd International Conference on Gas Discharge 11-15, Sep. 1972, Institute of Electric Engineers, London.

*Primary Examiner*—Eugene R. La Roche
*Attorney, Agent, or Firm*—Oblon, Fisher, Spivak, McClelland & Maier

[57] ABSTRACT

Apparatus for treating a flow of material by an electric arc generates free radicals and/or atoms, and charged species, in ground or excited states. A cathode (13) and an anode (14) are arranged for striking an arc across a preferably annular gap and provide a pathway for flow of material through the gap between the cathode and anode. Each electrode has a region providing a continuous closed path for the anode spot or cathode root respectively to travel around, and means, preferably magnetic means (19), for producing movement of the arc cause the anode spot and cathode root to travel around their paths in the same sense and in substantially the same time. Preferably the paths are circular paths in parallel planes on the anode and cathode respectively, and the length of the arc remains substantially constant during travel of the anode spot and cathode root around the paths. Preferably the cathode (13) comprises a rod having a plane end face with a circumferential edge for striking the arc. Preferably the cathode has a sharp edge for striking the arc and for providing the said continuous closed path for the cathode root.

57 Claims, 11 Drawing Figures

ELECTRIC ARC APPARATUS

BACKGROUND OF THE INVENTION

1. Field of the Invention

The present invention relates to apparatus and method for treating a flow of material by an electric arc. The invention is concerned in particular with a method and apparatus for treating a flow of gaseous material by passing the material through an arc to form an electrical plasma for generating (in a ground or excited state) free radicals and/or atoms, and charged species, in a jet of gas.

2. Description of the Prior Art

It is known to provide apparatus for producing an electrical plasma sometimes known as a plasma torch, in which a cathode and an anode are provided within a housing and define an annular space through which a gaseous feed stock (a gas, vapour, suspension or other gaseous material) is passed, and a plasma is produced by striking an arc across a gap between the cathode and anode. Where the gaseous material passes through the gap under pressure and emerges in a stream of material, the plasma takes the form of a jet extending from the arc region and sometimes referred to as a plasma jet. In one known form of such a plasma torch, the cathode comprises a rod and the anode comprises a cylindrical structure with a frusto-conical surface extending inwardly at one end of the cylinder, the cathode rod and the anode cylinder being coaxial, with the tip of the cathode rod positioned inside the region surrounded by the frusto-conical surface. The end of the cathode is initially pointed or dome-shaped and the arc is struck between the tip of the cathode rod and a region on the frusto-conical surface of the anode. At the center of the frusto-conical surface of the anode is an aperture leading along the axis of the anode cylinder and through the anode for exit of the gaseous material which passes through the region where the arc is struck. The place on the cathode from which the arc is struck is sometimes known as the cathode root and the place on the anode at which the arc is struck is sometimes known as the anode spot.

It is known to provide an annular magnet around the cathode-anode axis for providing a magnetic field in the region of the cathode-anode gap. The magnetic field is arranged in such a manner as to cause the arc to move in a generally rotary manner around the longitudinal axis of the cathode and anode, and in this movement the anode spot travels in a generally circular path around the frusto-conical surface of the anode. However the cathode root does not move in any organised manner on the cathode and moves erratically between positions which give the minimum anode to cathode spacing for the arc. In some cases the cathode root may remain at a position until the cathode surface at that spot is sufficiently eroded by the arc to force the arc to jump to another position which again gives a minimum cathode to anode spacing for the arc. Thus in some cases the manner of operation of the arc may be that the cathode root makes intermittent, random jumps to new cathode root positions after damage has been inflicted on the cathode by erosion at the previous cathode root position.

The present invention is particularly concerned with the more efficient use of a plasma jet for generating (in a ground or excited state) free radicals and/or atoms, and charged species, in a jet of gas.

The most sophisticated plasma jets used in previous work have used a pointed cathode (usually of thoriated tungsten) surrounded by a water cooled anode (usually Cu, brass or steel), and were provided with a circumferential solenoid to form an electromagnet. The axial component of the magnetic field produced by the latter interacted with the radial component of the current, causing the D.C. arc to rotate at high speed about the central cathode. This helped to heat the gas more uniformly, to generate swirl and turbulence, and to minimise anode erosion.

However, such use of a magnetic field does not cause the cathode root to move in any organised fashion. Melting tends to occur at the pointed tip of the cathode and the achievement of a compromise between the danger of rapid consumption of the cathode and the need to maintain the cathode root at a sufficient temperature for plentiful electron emission is made difficult in the case of some gases by electron attachment, by the absorption of much energy during dissociation, and by other factors. It has been the practice in previously known methods to include in the feed stock material an admixture of large amounts of argon or other suitable monatomic gas additives.

SUMMARY OF THE INVENTION

According to the present invention there is provided apparatus for treating a flow of material by an electric arc, comprising a cathode and an anode arranged for striking an arc across the gap between the cathode and the anode and arranged to provide a pathway for flow of material through the gap between the cathode and the anode, in which the anode has a region providing a continuous closed path for the anode spot to travel around in operation, the cathode has a region providing a continuous closed path for the cathode root to travel around in operation, and there is provided means for producing movement of the arc struck between the cathode and the anode such that the anode spot and the cathode root travel around their respective continuous closed paths in the same sense and in substantially the same time.

By the terms cathode and anode is meant electrodes which in operation are intended to act as cathode and anode respectively when connected to an appropriate source of unidirectional voltage.

The terms anode spot and cathode root mean the places on the anode and cathode respectively between which the path of the arc is struck at any particular instant of time.

It is to be appreciated that as the anode spot and cathode root progress repeatedly around their respective paths, there may occur for any particular corresponding pair of complete progressions slight variation in the times taken, and also that during such progressions the travel along one path may marginally advance or retard relative to the travel along the other paths. However it will normally be preferred that the anode spot and cathode root travel together in regular manner, as nearly as possible in correlation with each other, and at rates of travel such that the times of completed progressions are the same for corresponding progressions around the two paths.

Furthermore it may occur that the times taken for successive completed progressions around the respective paths may vary during a number of repeated progressions. That is to say that the movements of the anode spot and cathode root around their respective paths are not necessarily accurately and reproducible periodic movements in all embodiments of the invention. However it is much preferred that the arc moving means is such that in operation the movements of the anode spot and cathode root around their respective paths are periodic movements.

Similarly, it is to be appreciated that in some embodiments of the invention it may be desirable for the distance between the anode spot and the cathode root to vary during progression of the anode spot and cathode root around their respective paths (either due to variations in the spacing between the paths or due to variations in the rates of travel of the anode spot and cathode root) with consequent change of arc length. However, it is much preferred that the shape of the cathode and the anode and the arrangement of the arc moving means are such that in operation the length of the arc remains substantially constant during travel of the anode spot and cathode root around their respective paths.

It is preferred that the said continuous closed paths of the cathode root and anode spot lie in respective, spaced-apart parallel planes, and it is also preferred that the said continuous closed paths are circular paths. Most preferably the circular paths are arranged with their centers lying on a common axis which most preferably is arranged to be perpendicular to spaced-apart parallel planes in which the circular paths lie.

It is to be appreciated that in some embodiments the paths may be elliptical, or indeed may follow other closed continuous configurations. The paths are preferably arranged to lead around a common axis, and where the paths lie in parallel, spaced-apart planes, it is preferred that the common axis of the paths is perpendicular to the parallel, spaced-apart planes.

It is also preferred that the cathode has an elongated form and has a general longitudinal axis. In such cases, it is preferred that the general longitudinal axis of the cathode should be aligned along the said common axis around which the closed continuous paths preferably lead.

In a particularly preferred form of the invention, the cathode comprises a cylindrical body having, at an end thereof adjacent to the anode, a plane end face perpendicular to a longitudinal axis of the body, the said continuous closed path of the cathode root being provided around the perimeter of the plane end face of the cylindrical body. It has been found convenient for such a cathode to comprise a rod having a diameter in the range 1 to 5 mm.

It is a particular preferred feature of the invention in some aspects for the cathode to have an edge for striking the arc (preferably extending along a continuous closed configuration) for providing the said continuous closed path for the cathode root. Thus where the cathode comprises a cylindrical body with a plane end face, the said edge is conveniently formed around the perimeter of the plane end face, and comprises an edge having an angle of 90°. It will be appreciated that in other arrangements the edge may have an angle greater or lesser than 90°, for example by comprising a bevelled edge, or a sharp acute edge formed for example in an outstanding flange or lip. In general the criteria determining the sharpness of the edge are that the edge shall be sufficiently sharp to concentrate the lines of the electric field for striking the arc when in operation a potential difference is applied across the cathode-anode gap, and the edge shall have an angle sufficiently great to provide adequate conduction of heat away from the edge while the arc is being struck.

In accordance with another preferred feature of the invention, the anode-cathode gap may be an annular gap, and the anode may have an aperture through the anode coaxial with the annular gap for passage of material which has passed through the said annular gap. Conveniently where the cathode has an elongated form and has a general longitudinal axis, the anode aperture is aligned along the longitudinal axis of the cathode.

Where an aperture is provided through the anode, the anode is preferably shaped to provide in the region of the cathode an entrance to the aperture having a decreasing cross-section and to provide at the other end of the aperture an exit having an increasing cross-section, the arrangement being adapted to provide in operation an expansion of material passing out from the anode aperture.

Conveniently the anode has facing the cathode an inwardly tapering, frusto-conical surface coaxial with and leading to the aperture through the anode, the arrangement being such that in operation the said continuous closed path of the anode spot lies in the frusto-conical surface of the anode. The semi angle of the frust-conical surface is preferably in the range 30° to 50°, and most preferably is substantially 45°. Conveniently the anode has a further frusto-conical surface formed on a side of the anode remote from the cathode and coaxial with the aperture through the anode. The semi-angle of the further frusto-conical surface is preferably in the range 50° to 70°, where the pressure difference is sufficient for sonic flow, most preferably substantially 60°. The arrangements of the anode in connection with the aperture therethrough may in appropriate circumstances be arranged so that in operation gaseous material passing out from the aperture is subjected to a supersonic expansion.

It is a further particular preferred feature of the invention that the arc length can be varied for particular circumstances of operation, so that for a given flow rate of material through the anode-cathode gap, and for a given potential difference across the anode cathode gap, the amount of energy available for treatment of the material may be carefully varied or "tuned". To achieve this there is preferably provided adjustment means for varying the said anode-cathode gap. Where the anode-cathode gap is an annular gap, the adjustment means is conveniently arranged to provide relative movement between the anode and the cathode along the axis of the annular gap, the configuration of the cathode and anode combination being such that the relative movement along the said axis produces variation in the anode-cathode gap. This is conveniently arranged for example by a combination of a cylindrical cathode and an anode having a frusto-conical surface as has been set out hereinbefore.

It is much preferred that the required movement of the arc is provided mainly or wholly by means for producing a magnetic field in the region of the cathode-anode gap, although in alternative, less preferred, arrangements the means for producing the movement of the arc may comprises non magnetic means, for example means for inducing swirl in a gaseous medium passing through the gap between the anode and the cathode. It will be appreciated that various combinations of magnetic and non-magnetic means may be used for producing the required arc movement, the non magnetic means being used either to reinforce, or to act against, the arc movement produced by magnetic means.

Preferably the magnetic field means is arranged to produce in the region of the cathode anode gap a magnetic field having a predominant component at right angles to the arc. Conveniently the magnetic field is aligned along a general longitudinal axis of the apparatus, which conveniently comprises the axis of an annular anode cathode gap and also the axis of a generally cylindrical cathode. Where the anode cathode gap is an annular gap, the magnetic field means conveniently comprises an annular magnet coaxial with the said annular gap.

Where the arc moving means comprises magnetic means, it is preferred that the magnet is spaced from the anode-cathode gap and the magnetic field is focussed to the anode-cathode gap by support means for the anode and/or cathode. Such support means can conveniently be formed of mild steel. Such an arrangement allows a high magnetic field strength to be maintained in the region of the arc without exposing the magnet to high temperatures. It is preferred that the magnet is a permanent magnet because, inter alia, a permanent magnet can be smaller, does not require insulated windings as found on an electromagnet, which windings are subject to damage by high temperature and high voltage which may sometimes by used in striking the arc. By way of example, a preferred form of the magnetic field means may comprise a permanent annular magnet such as to produce along its axis when situated in air a maximum field in the range 250 to 350 gauss.

As has been mentioned, it is also possible to effect the required movement of the arc by non-magnetic means, alone, or more conveniently in combination with magnetic field means. Such arc moving means may comprise means for inducing in the flow of material through the anode-cathode gap a component of motion generally transverse to the length of the arc. Where the anode-cathode gap is an annular gap the arc moving means may comprise means for inducing a flow of material to be treated in a direction generally tangential relative to the axis of the annular gap. Such a tangential flow will not normally be directed tangentially to the annular gap, but will be tangential to a larger cylindrical chamber coaxial with the annular gap and leading thereof. Alternatively or in addition, the arc moving means may comprise swirl vanes for producing a rotary motion in the material to be treated.

By way of example, the cathode may conveniently be formed of thoriated tungsten, tungsten, or mild steel, and the anode be formed of brass, copper or similar material.

Further by way of example of preferred ranges of dimensions which may be used, the shortest distance across the anode-cathode gap may lie in the range 250 to 350 microns.

In the same arrangements embodying the invention, there may occur across the anode-cathode gap three different classes of voltage. When the apparatus is quiescent, without the arc struck, the open circuit voltage across the anode-cathode gap may be greater than 200 volts. To start the striking of the arc there may be required the application across the gap of a trigger voltage of the order of 20 KV. During normal running operation of the apparatus when the arc has been struck, the running voltage across the arc may be in the range 40 to 120 volts. Conveniently there may be provided means for applying across the anode-cathode gap a potential difference such that in operation the passage of current across the gap by means of the arc during normal continuous operation consumes a power in the range 400 to 1500 watts.

In preferred forms of the apparatus, the apparatus is adapted to pass the said material through the anode-cathode gap in a gaseous form. Such a form may consist of a true gas, a vapour, or other gaseous material, for example, a suspension of metal particles in a gas. The apparatus may conveniently include a housing providing a pressure chamber for receiving under pressure the material to pass through the cathode-anode gap, the apparatus having an inlet for supplying material under pressure to the pressure chamber, and an outlet for passage of material out from the region of the anode-cathode gap after the material has passed through the said gap and has been treated by the arc. There may be provided means for producing a flow of the said material through the anode-cathode gap at a flow rate in the range 60 to 500 ml/s.

In the foregoing paragraphs there have been set out a number of preferred and optional features of apparatus according to the present invention. In accordance with one particularly preferred combination of some of the aforesaid preferred features there is provided apparatus for treating a flow of material by an electric arc comprising a cathode and an anode arranged for striking an arc across a gap between the cathode and the anode and arranged to provide a pathway for flow of material through the gap between the cathode and the anode, in which the anode-cathode gap is an annular gap, the anode has a region providing a circular path for the anode spot to travel around in operation, and the cathode has a region providing a circular path for the cathode root to travel around in operation, the circular paths being substantially coaxial, and there being provided means for producing movement of the arc struck between the cathode and the anode such that the anode spot and cathode root travel around their respective paths in the same sense and in substantially the same time with the length of the arc substantially constant during travel of the anode spot and cathode root around the said respective paths.

In accordance with another particularly preferred combination, there is provided apparatus for treating a flow of material by an electric arc comprising a cathode and an anode arranged for striking an arc across a gap between the cathode and the anode and arranged to provide a pathway for flow of material through the gap between the cathode and the anode, in which the anode-cathode gap is an annular gap, the anode has a region providing a circular path for the anode spot to travel around in operation, and the cathode comprises a cylindrical body having, at an end thereof adjacent to the anode, a plane end face perpendicular to a longitudinal axis of the body, the end face having around the perimeter thereof an edge for striking the arc and for providing a circular path for the cathode root to travel around in operation, there being provided means for producing movement of the arc struck between the cathode and the anode such that the anode spot and cathode root travel around their respective paths in the same sense and in substantially the same time with the length of the arc substantially constant during travel of the anode spot and cathode root around the said respective paths.

There is also provided in accordance with the present invention a method of treating a flow of material by an electric arc comprising the steps of passing a flow of material through a gap between a cathode and an anode, striking an arc across the gap between the cathode and the anode, and producing movement of the arc struck between the cathode and the anode such as to cause the anode spot to travel around a closed continuous path on the anode and to cause the cathode root to travel around a closed continuous path on the cathode, the anode spot and the cathode root being caused to travel around their respective continuous closed paths in the same sense and in substantially the same time. As has been set out hereinbefore with reference to the apparatus aspect of the invention, it will normally be preferred that the anode spot and cathode root travel together in regular manner, as nearly as possible in correlation with each other, and at rates of travel such that the times of completed progressions around their respective paths are the same for corresponding progressions around the two paths. Furthermore it is much preferred that in the method the movements of the anode spot and cathode root around their respective paths are periodic movements. In general, the various features, preferred and optional, of the invention which have been set out above in connection with the apparatus according to the invention are also available as features of the method aspect of the invention.

Preferably in accordance with the method of the invention the length of the arc remains substantially constant during travel of the anode spot and cathode root around their respective paths. Preferably the method includes the step of causing the cathode root and anode spot to move around the said continuous closed paths in respective spaced apart parallel planes. Most preferably the said continuous closed paths are circular paths.

In accordance with one particularly preferred feature, the method may include the step of causing the cathode root to travel around its said continuous closed path around the perimeter of a plane end face of a cylindrical body forming the cathode, the plane end face being perpendicular to the longitudinal axis of the cylindrical body.

In accordance with another particularly preferred feature the method may include the step of striking the arc at an edge on the cathode extending around a closed configuration, and causing the cathode root to travel around its said continuous closed path around the said edge.

Conveniently the method includes the step of arranging the anode-cathode gap as an annular gap and causing the materal passing through the anode-cathode gap to pass subsequently through an aperture through the anode coaxial with the annular gap. Preferably the method includes the step of causing the material passing through the anode-cathode gap to pass through an entrance to the anode aperture having a decreasing cross section and through an exit from the anode aperture having an increasing cross section, in such a manner as to cause an expansion of the material passing out from the anode aperture, most preferably causing a gaseous materal passing out from the aperture to be subjected to a supersonic expansion.

It will normally be preferred in accordance with the invention that the method includes the step of passing the said material through the anode-cathode gap in gaseous form.

In accordance with another particularly preferred feature the method includes the step of varying the said cathode-anode gap in order to impart to the material passing through the gap a required energy to produce a required treatment of the material.

Preferably the method includes the step of producing movement of the arc by producing a magnetic field in the region of the cathode-anode gap, conveniently a magnetic field having a predominant component at right angles to the arc. Alternatively or in addition the method may include the step of producing movement of the arc by inducing in the flow of material through the anode-cathode gap a component of motion generally transverse to the length of the arc. In such latter arrangement the method may include the steps of arranging the anode-cathode gap as an annular gap and inducing a flow of material to be treated in a direction generally tangential relative to the axis of the annular gap. Alternatively or in addition the method may include the steps of arranging the anode-cathode gap as an annular gap and passing the material to be treated through swirl vanes for producing a rotary motion in the material to be treated.

In the foregoing paragraphs there have been set out a number of preferred and optional features of the method according to the present invention. In accordance with one particularly preferred combination of some of the aforesaid preferred features there is provided a method of treating a flow of material by an electric arc comprising the steps of passing a flow of gaseous material through an annular gap between a cathode and an anode, striking an arc across the gap between the cathode and the anode, and producing movement of the arc struck between the cathode and the anode such as to cause the anode spot to travel around a circular path on the anode, and to cause the cathode root to travel around a circular path on the cathode substantially coaxial with the said path on the anode, the anode spot and the cathode root being caused to travel around their respective paths in periodic movements in the same sense and in the same period with the length of the arc substantially constant during travel of the anode spot and cathode root around their respective paths.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
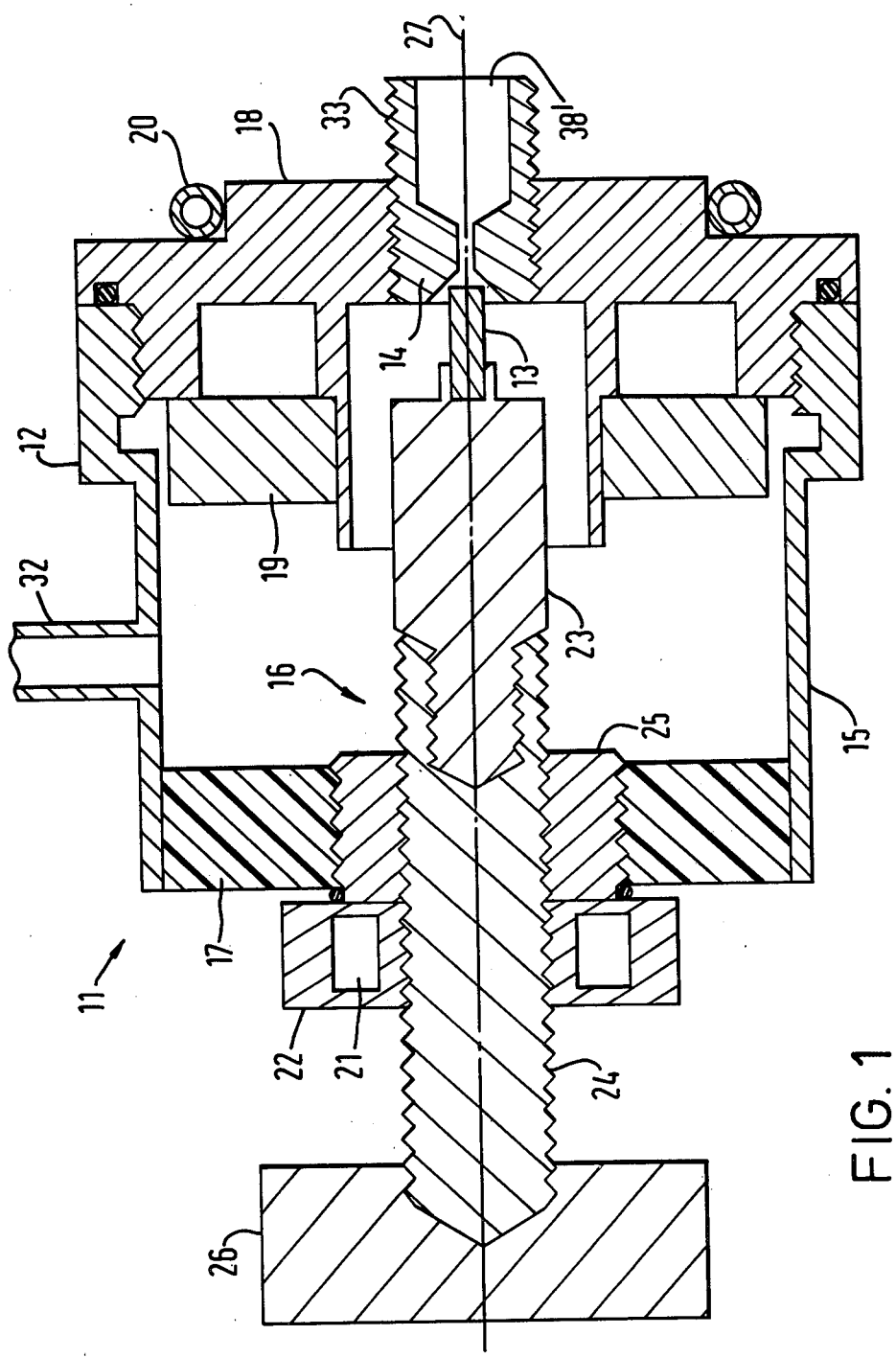
FIG. 1 is a cross-sectional view of apparatus embodying the present invention for producing an electrical plasma.

Referring now to the drawings, wherein like reference numerals designate identical or corresponding parts throughout the several views, and more particularly to FIG. 1 thereof, apparatus for treating a flow of gaseous material by an electric arc, commonly known as a plasma torch, is indicated generally at 11 and comprises a housing 12 provided with a cathode 13 and an anode 14. The housing 12 is formed by a cylindrical housing wall 15 supporting a cathode assembly 16 in which the cathode 13 is mounted, the cathode assembly 16 being mounted in the cylindrical wall 15 by an annular insulating wall 17. (In a modified arrangement, the walls 15 and 17 may be made as a single unit of synthetic plastics material, for example nylon. This will not usually be suitable for high temperature applications). The cylindrical wall 15 also supports the anode 14 by way of a mild steel support plate 18 which also supports an annular permanent magnet 19 positioned around the inner end of the cathode assembly 16. The sense of magnetisation of the annular magnet is such that the poles are formed in the opposed parallel end faces of the magnet. Provision is made for optional water cooling by annular water passageways 20 and 21, the latter formed in an annular metal collar 22 mounted on part of the cathode assembly 16 positioned exterior of the housing 15.

The cathode 13 comprises a cylindrical rod mounted in a cathode support 23 made of mild steel and forming part of the cathode assembly 16. Fixedly secured to the cathode support 23 is a lead screw 24 mounted for rotation in a threaded collar 25 and controlled by rotation of a cylindrical knob 26. Rotation of the knob 26 provides precise adjustment of the axial position of the cathode 13 along a general longitudinal axis of the cathode and anode indicated at 27. This precise adjustment is achieved by the combination of the thread of the lead screw and the effect of the inclined frusto-conical face of the anode.

Figure 3:
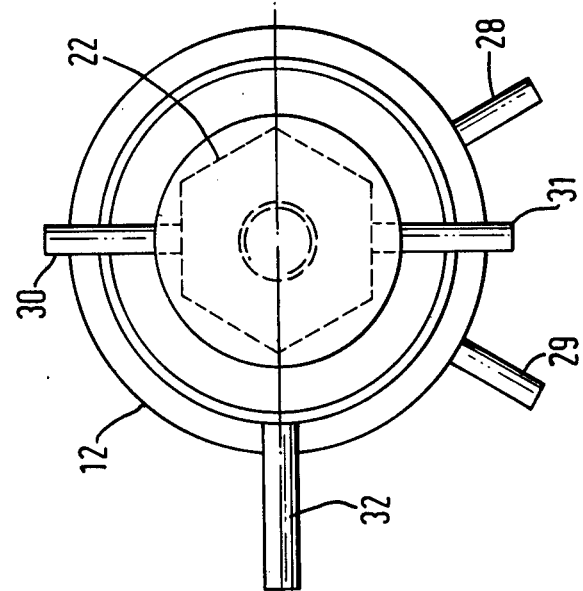
FIG. 3 is an end view of the apparatus shown in FIGS. 1 and 2.
Figure 2:
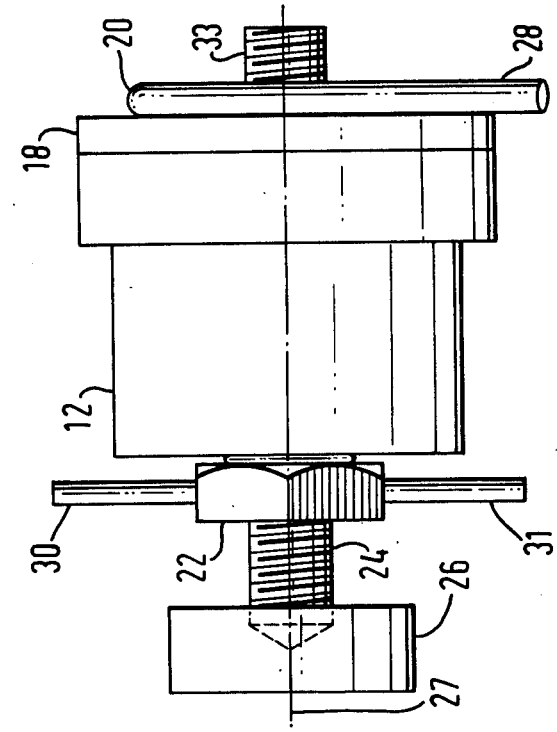
FIG. 2 is a side view on a similar scale of the apparatus shown in section in FIG. 1.

As shown in FIGS. 2 and 3, water supply to the water cooling passageways 20 and 21 is provided by way of conduits 28 and 29, and conduits 30 and 31 respectively. Inlet to the housing 12 is provided by way of an inlet conduit 32 for inlet of gas or other feed stock for the plasma torch, and outlet of gas from the plasma torch is provided by an outlet conduit indicated generally at 33.

There will now be described with reference to FIGS. 1 and 4, the geometry of a preferred configuration of cathode and anode in accordance with the embodiment of the present invention shown in the figures. The cathode 13 comprises a cylindrical rod with an end face 34 adjacent the anode 14 formed as a planar end face perpendicular to the axis 27 of the cathode. The anode 14 has an inwardly directed frustoconical surface 35 coaxial with the axis 27 and positioned in operation around the end face 34 of the cathode 13. The anode 14 is formed of a generally cylindrical body in which the frusto-conical surface 35 is formed at one end of the cylinder. The frustoconical surface 35 is coaxial with the longitudinal axis 27 and terminates at its inner end in an aperture 36 extending through the anode cylinder 14. The aperture 36 terminates in a further frusto-conical surface 37 which opens into a passageway 38 leading through the outlet conduit 33 to the exterior of the housing 12. As shown particularly in FIG. 4, the frusto-conical surface 35 is arranged to subtend a total angle of 90° and the frusto-conical surface 37 is arranged to subtend a total angle of 120°. In other arrangements the total inlet angle may be less than or more than 90°. There may for example be advantage in some arrangements in having the total inlet angle less than 90° so as to give a finer degree of control over the cathode-anode spacing for a given thread of the adjustment screw 24.

Preferably the cathode 13 is formed of tungsten, thoriated tungsten, mild steel, or other similar material and the anode 14 is made of brass or other similar material. For efficient operation the metals of the anode and cathode need to be chosen to be dissimilar metals with very different thermionic work functions at the potential used.

In operation, a gas or other feed stock in which the plasma is generated is fed into the housing 12 through the inlet conduit 32, and an arc is struck between the cathode 13 and the anode 14. The interior of the housing 12 is maintained at a higher pressure than the pressure at the outlet conduit 33, and the gas treated by the arc at the anode-cathode gap passes out of the reactor vessel along the aperture 36 in the anode 14. The arc may be initiated by a trigger high voltage to any metal part of the apparatus or, less preferably, by direct contact initially between the cathode 13 and the anode 14. Fine control over the spacing between the cathode 13 and the anode 14 is achieved by rotation of the knob 26.

In operation the apparatus is energised by a direct current source by connections made to the cylindrical wall 15 of the housing 12 (positive) and to the cathode assembly 16 (negative). The device is sealed by the outer cylindrical wall 15, and isolated electrically from the cathode assembly 16 by the wall 17 of insulating material. Preferably the plasma feed stock in the housing 12 is pressurised relative to the pressure at the outlet 38 by an amount sufficient to achieve sonic or supersonic flow through the aperture 36 in the anode 14.

In operation the arc between the cathode 13 and anode 14 is caused to rotate by the magnetic field applied by means of the permanent magnet 19 which is held magnetically to the plate 18 through which the magnetic field is magnetically coupled to the anode 14. The magnetic field is focussed to the anode-cathode gap by the cathode support 23. In alternative arrangements, an electro magnet may be used in place of the permanent magnet 19. As has been mentioned, water cooling may be supplied in operation but in some applications this is found to be unnecessary.

Figure 4:
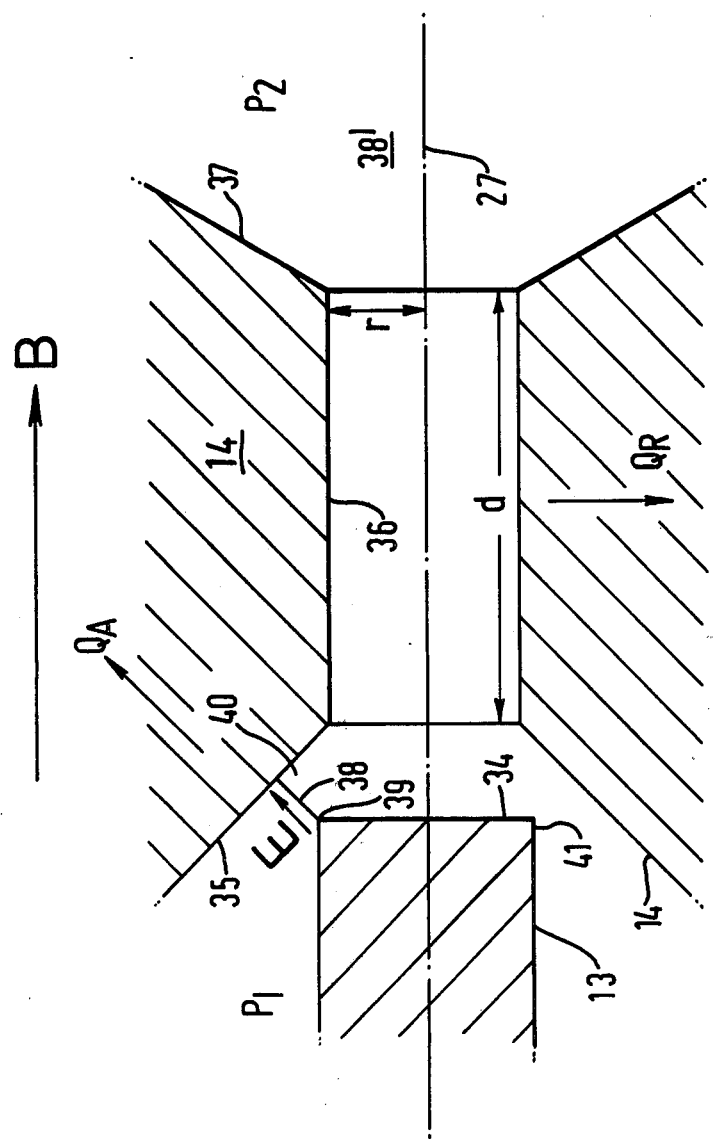
FIG. 4 is a cross-section showing in magnified scale the arrangement of an anode and cathode of the apparatus shown in FIG. 1.

Referring now particularly to FIG. 4, there will be explained the manner of operation of the arc. Once the arc has been established, it passes as indicated at 38 across a route which is the shortest distance between the cathode 13 and the anode 14. (In some circumstances the arc route may be slightly curved and may be longer than the shortest distance, but in normal circumstances the gap will be sufficiently small for the arc to follow a substantially straight line and this will be assumed in the following explanation). With the geometry shown in FIG. 4, this shortest route of the arc 38 is approximately at right angles to the frusto-conical surface 35 and joins the cathode 13 at a cathode root 39 on the edge of the plane end surface 34 of the cathode 13. The anode spot is indicated at 40 on the frusto-conical surface 35 of the anode 14. An advantage of combining the shape of a plane, perpendicular ended cylindrical cathode with a frusto-conical surface of an anode is that for a given position of the cathode 13 the length of the arc 38 remains constant for any position of the arc around the circular edge of the end surface 34 of the cathode 13. The spacing used is generally independent of the magnetic field, and only affects the rotation rate in as far as it affects the current in the arc for a given voltage and thus the Lorentz force causing the movement. Since the mild steel cathode support 23 (FIG. 1) focusses the magnetic field of the magnet 19 down to the cathode-anode gap to provide a magnetic field indicated at B in FIG. 4, the effect of this magnetic field on the arc at 38 will be to make the arc rotate around the longitudinal axis 27 of the cathode-anode assembly. This will cause both the anode spot 40 and the cathode root 39 to travel around circular paths coaxial with the longitudinal axis 27. Since the arc 38 will be of constant length during this rotation the movement of the arc will be regular without any tendency to stick in one place and cause erosion of the cathode 13. This uniform manner of rotation also results in greater uniformity of heating of the gas passing through the arc. The current and magnetic field are arranged to produce a rate of rotation of the arc such as to maintain the edge of the cathode at a temperature at which it will provide a plentiful supply of electrons, yet not be deformed or eroded by being kept at a high temperature for too long.

One factor in optimising the magnetic field strength is that the speed of arc rotation must be high enough to avoid too long a period of heat transfer to the electrodes in any particlar area, yet not so high that insufficient time is allowed for cooling of the electrodes, due to thermal inertia, before the next rotation of the arc. Another factor which has been noticed in connection with the arrangement shown in FIG. 4 is believed to operate as follows. As can be seen in FIG. 4, the field strength B and the electric current along the arc are not perpendicular in normal operation. If the value of the magnetic field B is increased unduly it is believed that the field causes the arc to elongate by moving towards a perpendicular position with respect to the magnetic field B. If, as the arc elongates, the change in arc length is such that, for the given potential across the anode-cathode gap, the electric field intensity falls below that required for stable operation, then the arc would extinguish.

In selecting an optimum magnetic field for a particular arrangement factors which sould be considered include optimisation of the rate of rotation, and avoidance of components of arc movements that can move the arc away from its stable configuration.

It is to be appreciated that if the magnetic field were not provided, the arc would stay with the anode spot and cathode root 39 stationary until either electrode was sufficiently eroded to force the arc to jump to another position. The purpose of the rotation of the arc by the magnetic field is to maintain travel of the arc sufficiently quickly and regularly around the circular path to minimise or at least inhibit erosion from starting up. Initially the cathode is provided with a sharp 90° edge. Although after long use this is eventually somewhat rounded, this occurs much less rapidly than erosion in known arrangements and to a much lesser extent. The movement of the arc around the cathode is not intended to be intermittent but is arranged to be a regular continuous travel. If the field is not sufficiently strong to maintain this regular travel, the arc may stick in one place and return to the conventional operation with a stationary or intermittently moving cathode root.

There will now be given by way of example various ranges of dimensions and operating parameters which may be used in construction and operation of the apparatus described with reference to the figures. The diameter of the cathode 13 may conveniently be $\frac{1}{8}$ inch (3.2 mm) and in other arrangements may be selected from a convenient range of 1 to 5 mm. The anode-cathode gap may conveniently be adjusted to a spacing in the range 250 to 350 microns for many aplications. Other parameters may be as folows:

| | |
|---|---|
| Semiangle of surface 35 | 40° to 50° |
| Semiangle of surface 37 | 50° to 70° |
| Diameter of anode orifice 36(2r). | 2.0 to 1.5 mm |
| Length of anode orifice 36(d) | 3.0 to 4.0 mm |
| Change in anode-cathode gap per degree of rotation of cathode (for semiangle of 45°) | 2 microns |
| Voltage across anode-cathode gap during normal arc operation | 40 to 120 V (eg 80 V) |
| Current conducted by arc during normal arc operation | 16 to 8 amps (eg 10 amps) |
| Power consumed by arc during normal arc operation | $\frac{1}{2}$ to 2 kW (preferably 400 to 1500 W) |
| Flow rate through gap | 60 to 500 ml/s |
| Frequency of arc rotation | in the region of 300 c/S |
| Pressure difference $P_1-P_2$ | 0.1 to 5 atmospheres |
| Pressure ratio $P_1/P_2$ | 4 to 120 (eg 5) |
| Strength of magnet 19 at centre in air | 250 to 350 gauss |

Conveniently the electric field may be such as to produce, for example, field intensities of $10^3$ V/cm at 50 Volts. It is to be appreciated that it is not appropriate to consider the state of the gas in terms of temperatures at the anode-cathode gap of a plasma torch, but it is believed that at flow rates in the region f 200 ml/s the energy delivered to a feed stock gas may be 200 kJ per mole, which is equivalent to a temperature in the region of 10,000 C. for a monatomic gas.

Embodiments of the invention are primarily intended for use on polyatomic feedstocks for example nitrogen and hydrogen. For nitrogen, using experimental data for the device, and published thermodynamic data, temperatures have been calculated as follows (for an average arc condition):

| $N_2$ flow rate/(ml/sec) | Temp/K |
|---|---|
| 100 | ≃5800 |
| 500 | ≃3700 |

For hydrogen detailed calculations have not been completed, but an estimation would place both temperatures at ≃2000 K. higher than $N_2$ at each flow rate.

It should be noted that some devices embodying the invention may, by virtue of the electrical efficiency, have a distribution of temperature and species downstream of the anode. Some fraction of the feedstock gas ( as determined by the volumetric efficiency) has been 'heated' to a very high temperature producing the atoms, radicals etc. as required, while the remaining component has passed through the device absorbing the minimum of power. In this way if the species generated undergo subsequent exothermic reaction and/or recombination, there will be a resultant temperature profile that will be determined by mixing patterns and rates of reaction of the subsequent process.

It will be appreciated that the embodiment of the invention shown in the figures is distinguished from known arrangements of cathode and anode, inter alia, in that conventional cathodes have an initially pointed or domed shape in contrast with the plane-ended perpendicular face 34 of the cathode rod. A dome-ended or pointed cathode is normally operated with the cathode root not moving in any organised manner and positioned at random positions arrived at by the arc choosing the shortest route between the cathode and anode. However, other shapes of cathode 13 may be selected within the scope of the invention. For example the angle between the end face 34 and the cylindrical side wall (indicated at 41 in FIG. 4) may be selected to be close to, but not exactly, 90°. For example by having the end surface 34 slightly dished, the angle between the end surface 34 and the side surface 41 can be made to be less than 90°. Conversely, by having the end surface 34 slightly domed, the said angle can be arranged to be slightly greater than 90°. However, it will be appreciated that in either of these cases, the resultant cathode is distinguished from known cathodes in that there is provided a distinct edge or change of surface angle around the circumference of the cathode rod, and the cathode root is arranged to run around this distinct edge as the arc moves around the axis 27. Where the angle between the surfaces 34 and 41 is made much less than 90°, there arises the possibility of insufficient cooling of the cathode root by heat paths away from the cathode root into the cathode rod, and where the angle between the surfaces 34 and 41 is much greater than 90°, there arises the possibility of the cathode root wandering from the chosen path if there is an insufficiently strong electric field at the distinct edge along which the cathode root is intended to travel. In general it has been found preferable to have the surfaces 34 and 41 substantially at right angles to each other.

One advantage of striking the arc at an edge on the cathode is that the effect for the arc is the same as a point. In effect the arc is struck at a point defined by two lines in the plane of the end face and side face of the cathode, the lines and point being rotated to define the edge. One advantage of such an edge is that the electric field lines are concentrated by convergence at the edge.

In other forms the cathode may comprise a cylinder of metal the interior of which may be hollow or may be filled by a different metal or by some other material.

A further advantage of the combination of a plane ended cathode with a frusto-conical anode surface is that there is provided a fine control over the cathode-anode spacing. Axial movement of the cathode 13 by rotation of the knob 26 is resolved into a change in the cathode-anode gap which is reduced by a proportion of $1:\sqrt{2}$ for a semi-angle of 45°. Fine adjustment is available over a longer period of operation of the device because of the relatively low rate of erosion compared with previous arrangements. This fine adjustment of the cathode-anode spacing allows fine tuning of the electric field intensity (the applied voltage divided by the length of the arc) of the plasma torch to achieve particularly required characteristics of plasma from a given plasma feedstock. For a given flow rate of gas through the anode-cathode gap, the ability to control the electric field intensity precisely enables the choice of excitation of species to be generated. Such tuning should also taken into account other factors. An appropriate anode configuration, i.e. a particular surface to volume ratio in the anode aperture, and particular diameter of outlet nozzle, can be chosen to give a required plasma for any pressure of the region into which the housing 12 discharges. This gives a greater ability to operate into subsequent low pressure systems than is available with conventional plasma torches. In many respects the higher back pressure in the housing 12 relative to the region into which the torch operates, the better is the effect on the plasma generation efficiency.

By considering the effect of the geometry of the anode on the fine tuning by the knob 26, it will be seen that other inlet angles may be advantageous. For instance, if the anode has an inlet semi-angle of $\alpha$, then the fine tuning control obtained by knob 26 is $(\sin\alpha)/x$ per revolution, x being the number of threads per inch of component 24. For a given value of x (eg 26 or 40 TPI) there would be a fine tuning advantage on the arc distance by choosing $\alpha$ less than 45°, eg a semi-angle of 30°.

The importance of fine tuning in operation is that for a given value of applied voltage and flow rate of feedstock, the tuning enables control over the field intensity (defined here as applied voltage/arc length) such that it is possible to control the excitation of the atoms/radicals generated. This has been found to be the case by examination of the emission spectra of the nitrogen recombination spectra.

Because the fine tuning of the arc for selective excitation depends on the volumetric flow rate of gas through the gap (as well as other factors) it is important when such tuning is desired, that fluctuations in the downstream pressure $P_2$ (FIG. 4) do not produce changes in the upstream pressure $P_1$. When the upstream pressure $P_1$ is sufficient for the velocity of sound to be reached in the anode orifice, fluctuations in the downstream pressure will not feed back and will not affect the upstream pressure. When the pressure ratio $P_1/P_2$ is above the critical value to achieve the speed of sound in the anode orifice, pressure fluctuations in the pressure $P_2$ in no way affect $P_1$ and therefore do not affect the stable operation of the arc. This effect is important where the anode orifice opens into a region liable to pressure variations, for example in a pulsating exhaust system.

Another factor which needs to be considered is the surface to volume ratio of the anode. Referring to FIG. 4 the following may be defined:

$P_1/P_2$ = pressure ratio (or expansion ratio)

$Q_A$ = heat lost from anode spot of arc to anode $Q_R$ = heat lost from cylindrical surface of anode orifice due to recombination within orifice.

$Q_R$ is a function of d and S/V (Both $Q_A$ and $Q_R$ have to be dissipated by water or alternative cooling, and lower the electrical efficiency).

r = orifice radius

S/V = surface to volume ratio of orifice $(2/r^2)$ $\beta$ = recombination coefficient.

$\beta$ is a function of S/V and $P_1/P_2$ and is very important for electrical efficiency measured by atoms entering the $P_2$ region.

$P_2$ is dictated by the operating condition (eg atmospheric, 60 Torr etc) which sets a range of $P_1/P_2$ that may be used depending on operating criteria.

Generally one wants to optimise $P_1/P_2$ as large as possible to increase dissocation and to increase lifetime in the $P_2$ region. However this must be done while minimising $Q_A$, $Q_R$, S/V, d and $\beta$, while maximising r to the point where $P_1/P_2$ may be maintained by the anode. (If d is too small, anode erosion is severe).

By way of example, dimensions which have given good results for the wide application are:

r = 1 mm
$P_1/P_2$ = 4 to 120
S/V = 2
d = 3 mm

These are suitable for nitrogen and in the pressure range 5 Torr to 1 atmosphere. Under these conditions, ground state atom generation rates have been found to be $10^{19}$ to $10^{21}$ atoms/sec and electrical efficiency about 50%. $\beta$ was in the range 0.4 to 0.5.

In one particular example of application the following anode dimensions were used:

r = 1 mm
$P_1/P_2$ = 16
S/V = 2
d = 2.9 mm

Where the feedstock gas was nitrogen, the device produced $10^{20}$ ground state (4s) atoms per second with an electrical efficiency of 53%.

Another preferred feature of the arrangement shown in the figures is that the magnet 19 can be a bonded ferrite permanent magnet which can be provided in an insulating casing. This allows minaturisation of the entire apparatus giving the possibility of use in various applications previously not available for conventional plasma torches. The use of such a type of magnet is made convenient by the focussing of the magnetic field down to the cathode-anode gap as has been described. In some applications of such a plasma torch, there is a danger that the temperature of the magnet will rise above the Curie point with consequent destruction of the magnet. It is therefore important to place the magnet in a relatively cool place in the assembly and then to focus the magnetic field down to the required position at the cathode-anode gap. The advantage of a permanent magnet is that there is no melting of the insulation which is present with the wiring of an electromagnet. Another advantage of using a permanent magnet rather than electromagnet is that if it is attempted to start the arc using a Tesla coil when using an electromagnet, the insulation on the windings of the electromagnet can breakdown leading to a short circuit and failure of the magnet.

It will be appreciated however that it is not essential for steel support means to be provided for focussing the magnetic field. The apparatus can be made to operate satisfactorily with a brass or aluminum cathode support material, provided that the magnet strength is increased correspondingly.

The effect of the magnetic field in rotating the arc also has a beneficial effect when required in producing swirl and turbulence in the gaseous stream leaving the outlet conduit 33.

There will now be given by way of example particular operating parameters which may be used for applications of the apparatus shown in FIGS. 1 to 4.

EXAMPLE 1

Generation of N atoms for exhaust gas cleaning

| Feedstock material | nitrogen gas |
|---|---|
| Cathode rod diameter | ⅛ inch (3.2 mm) |
| Anode-cathode gap | 300 microns |
| Voltage across gap | 80 volts |
| Current through arc | 10 amps |
| Power consumed | 800 watts |
| Flow rate | 100 ml/s at S.T.P. |
| Pressure drop ($P_1$-$P_2$) | 3 atmospheres |
| Strength of field of magnet 19 (at centre in air) | 300 gauss |

EXAMPLE 2

Generation of N atoms for exhaust gas cleaning

| Feedstock material | nitrogen gas |
|---|---|
| Cathode rod diameter | ⅛ inch (3.2 mm) |
| Anode-cathode gap | 300 microns |
| Voltage across gap | 80 volts |
| Current through arc | 10 amps |
| Power consumed | 800 watts |
| Flow rate | 500 ml/s |
| Pressure ratio $P_1/P_2$ | 3 |
| Strength of field of magnet 19 (at centre in air) | 300 gauss |
| Anode orifice radius r | 1.25 mm |
| Anode orifice length d | 3.0 mm |

EXAMPLE 3

Generation of plasma jet for cutting purposes

| Feedstock material | $H_2$ |
|---|---|
| Cathode rod diameter | ⅛ inch (3.2 mm) |
| Anode-cathode gap | 300 microns |
| Voltage across gap | 50 V |
| Current through arc | 30 A |
| Power consumed | 1500 W |
| Flow rate | 300 to 400 ml/s at S.T.P. |
| Pressure drop ($P_1$-$P_2$) | 4 atmospheres |
| Strength of field of magnet 19 (at centre in air) | 250 gauss |

EXAMPLE 4

Plasma jet as continuous H atom source for a jet ignitor

| Feedstock material | Hydrogen gas |
|---|---|
| Cathode rod diameter | 3 mm |
| Anode-cathode gap | 250 microns |
| Voltage across gap | 60 Volts |
| Current through arc | 9 amps |
| Power consumed | 540 watts |
| Flow rate | 500 ml/sec |
| Pressure Ratio $P_1/P_2$ | 3 |
| Strength of magnet 19 (at centre in air) | 300 gauss |
| Anode orifice radius r | 1.0 mm |
| Anode orifice length d | 3.5 mm |

Advantages which may arise in the use of the device operating in this mode are for example the ability to ignite kerosine sprays in cold environments (this was previously difficult even with surface discharge plugs) or the re-ignition of a high altitude jet engine after 'flame-out'. The working flow rate range that the device can handle using hydrogen is from 100 to 700 ml/sec.

Various advantages arise in the use of devices such as have been described and give rise to a number of particularly useful applications of such a torch. Preferred embodiments of the invention can be arranged to enable an electrical plasma to be produced from a gas or other feed stock continuously, at a low power input, and without the necessity for seeding or use of auxiliary gases such as argon. These gases are commonly used to improve arc stability but the presence of a monatomic gas such as argon necessarily reduces the efficiency in known plasma torches. Preferred embodiments of the invention can also be arranged to operate in many instances without any water cooling. The presence of water cooling necessarily implies a lower efficiency, since part of the energy put into the device is being conducted away rather than being used in the production of plasma.

In many instances the plasma torch will be coupled to a subsequent system in which chemical reactions are required. In such a case the plasma feedstock passes into the rotating arc region and issues from the anode into the downstream region where the required chemical process is taking place. Such a device may be used, with suitable choice of gaseous and other feedstocks to produce atoms, ions, electrons, radicals or other chemical entities which are subsequently reacted downstream of the apparatus in a chemical process that involves the entities generated within the device. The swirl which may be introduced into the plasma emerging from the anode (as has been mentioned) is advantageous in ensuring mixing of the entities generated by the device with the material to be processed subsequently downstream. By way of examples of feedstock, embodiments of the invention can be arranged to operate continuously on nitrogen or hydrogen inputs and may be used, if desired, as a source of nitrogen or hydrogen atoms. These atoms may be used, for example, for chemical processes such as the following.

In pollution removal use may be made of the reaction:

$N + NO \rightarrow N_2 + O$

Here nitric oxide is removed by nitrogen atoms producing molecular nitrogen and an oxygen atom that may be used for further processing. A plasma torch embodying the invention may be used to inject these atoms for example into the exhaust gases from a combustion plant, thus lowering the nitric oxide emission from such a plant.

Another example of pollution removal is in soot removal by oxidation or electrical modification of the soot forming process by material injected from the plasma torch. This will increase the rate of oxidation of the soot and/or modify its electrical surface properties and hence aggregation thus facilitating its removal from combustion products. Pollutants such as oxides of nitrogen and soot can be destroyed by the injection of the output from a nitrogen plasma.

A further example of use of material produced by a plasma torch embodying the invention is in the field of combustion enhancement by injection of appropriate chemical entities from such a plasma torch. For example hydrogen or nitrogen atoms may be used to increase flame stability, cause ignition and give faster combustion in fuel-lean mixtures with less pollution.

Another example of use of material produced by a plasma torch embodying the invention is in synthetic reactions. The injection of the appropriate chemical entities from the device may be used as a synthetic route to a number of important small molecules as well as polymers, for example the production of hydrogen cyanide by reaction of nitrogen atoms produced by a plasma torch embodying the invention with an appropriate hydrocarbon, for example methane.

The invention has applications to molecular beams as well as to lasers. The invention also finds use as an ignition source for a jet engine, where it may operate intermittently on a hydrocarbon or even on water vapour.

These examples are not intended to be exhaustive, but are merely given to illustrate some of the potential uses of embodiments of the invention.

Referring again to advantages which can be obtained from preferred embodiments of the invention, it is found that in appropriate embodiments, virtually any gas or vapour system can be readily dissociated into atoms, radicals and electrons with sufficient atom density to allow efficient reaction. For example $10^{20}$ N atoms/second can be generated. The efficiency of operation can be made much higher than previously in that more than 50% of the electrical energy supplied to the apparatus can be utilised in breaking bonds and the gas stream at the outlet can be made to remain relatively cool. Embodiments can run at a power of 500 W which is much lower than conventional plasma torches. The overall construction allows a simple and cheap plasma torch to be produced, the bulk of the construction materials being mild steel and brass and in some cases plastics material. As has been mentioned, a plasma torch embodying the invention can be made to be finely tunable so that atoms can be generated with a required internal electronic state. This can lead to specificity in reactions and yields approaching 100%. Thus in some arrangements it is possible to provide a continuously operating plasma jet which combines a high efficiency with high stability over a wide range of flows without requiring the use of an added monatomic gas such as argon.

Figure 5:
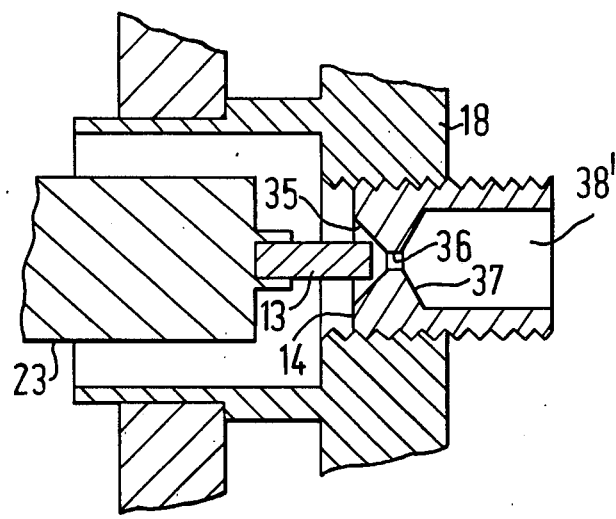
FIGS. 5, 6 and 7 show alternative modifications of the anode configuration shown in FIG. 1.
Figure 6:
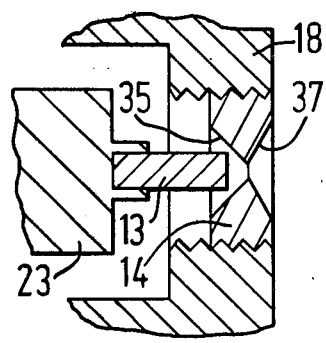
Figure 7:
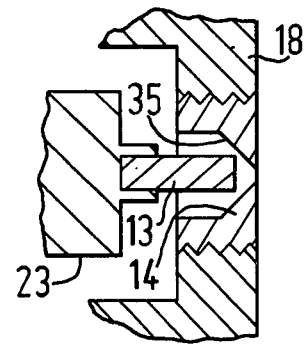

Referring again to the accompanying drawings there are shown in FIGS. 5, 6 and 7 modifications of the anode shown in FIGS. 1 to 4. In FIGS. 5, 6 and 7, elements corresponding to elements in the preceding figures will be referred to by like reference numerals. Similar notation will be used in other following figures. In FIG. 5, the anode is of the same general shape as that shown in FIG. 1, but the length of the anode aperture 36 is reduced. In FIG. 6 the cylindrical anode aperture has been omitted and the surfaces 35 and 37 meet directly. In FIG. 7, the frusto-conical exit from the anode aperture has been omitted and replaced by a flat, plane surface.

Figure 8:
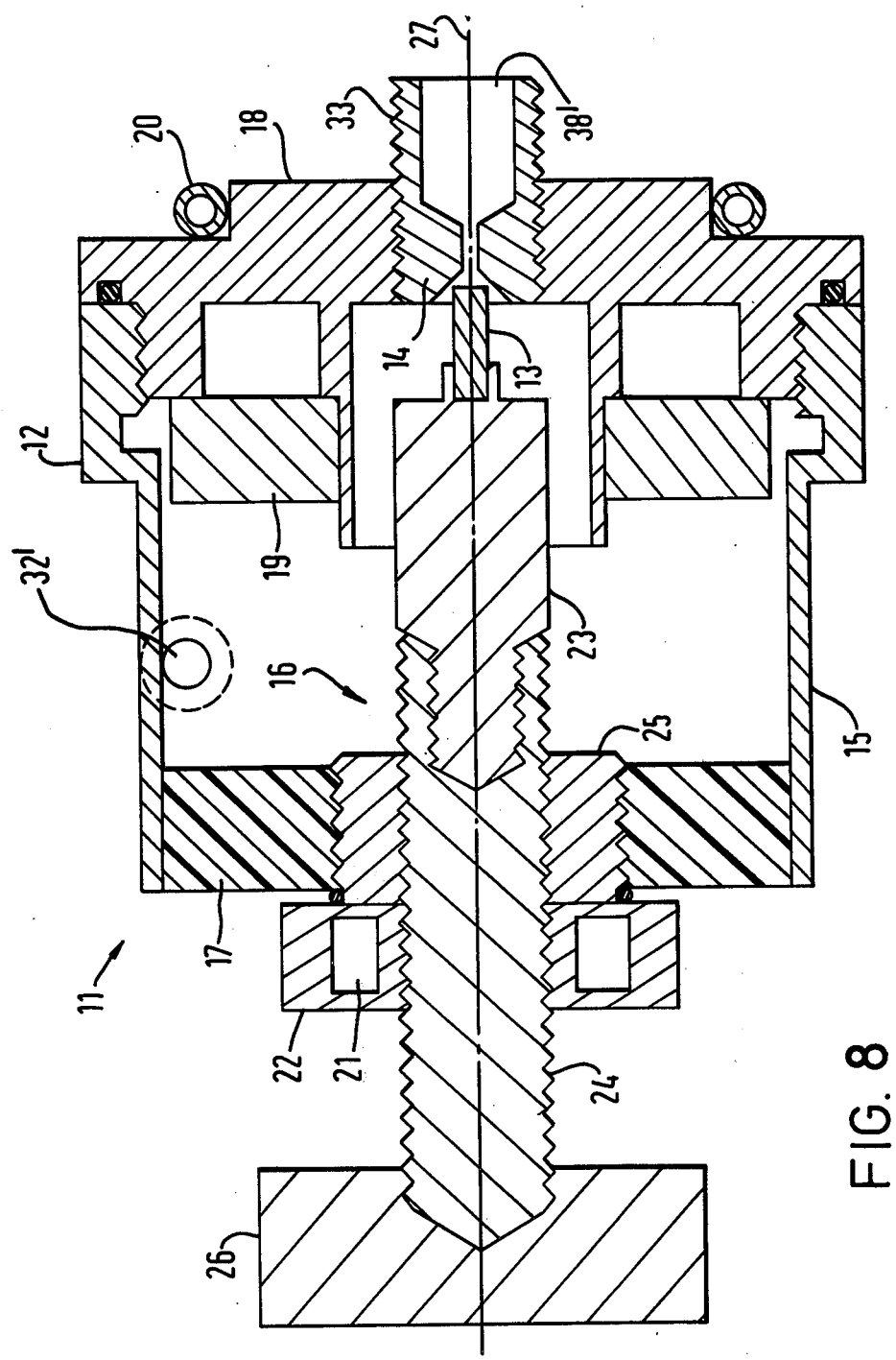
FIG. 8 is a cross-sectional view of a modification of the apparatus of FIG. 1, in which gaseous feed stock is introduced by a tangential inlet conduit.
Figure 10:
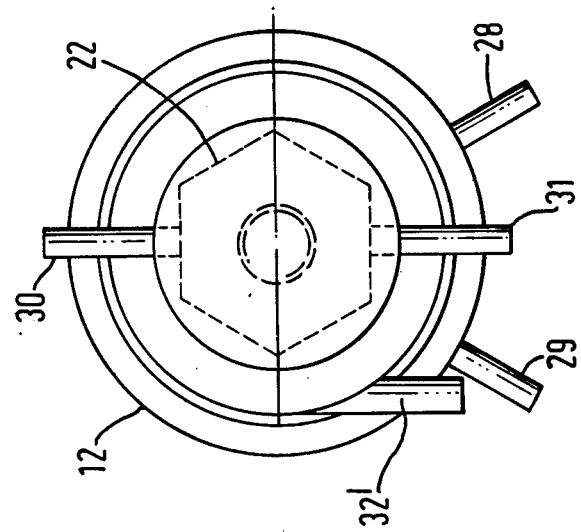
FIG. 10 is an end view of the apparatus shown in FIGS. 8 and 9.
Figure 9:
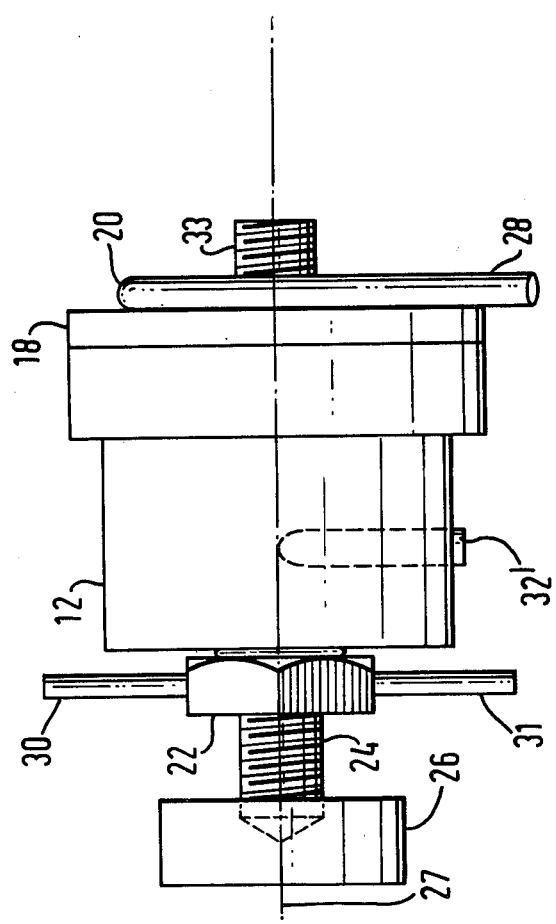
FIG. 9 is a side view on a smaller scale of the apparatus shown in section in FIG. 8.

Referring to FIGS. 8, 9 and 10, there will now be described a further modification of the embodiment of FIGS. 1 to 4. In this modification it is possible with the same electrode configuration to cause the arc to rotate by means of the manner of injection of the feed stock gas into the housing 15. Conveniently this may be carried out by positioning an inlet 32 in such a manner as to cause a tangential flow of the feed stock gas into the housing 12. The object of such an inlet is that at least a component of the gas flow shall impart an angular momentum to the gaseous material within the housing such as to cause the arc to rotate.

This means of causing the arc to rotate by a rotary movement of the gaseous feed stock can be used either alone, in place of the magnetic field described above, or in combination with such a magnetic field.

When the gas flow induced rotation of the arc is used alone in the absence of a magnetic field, some of the advantages set out above do not arise, because of the decreased relative motion between the arc and the gas. When a magnetic field induces rotation of the arc, the arc is forced to rotate through the gas thereby causing more uniform heating of the gas. In the case where gas flow induced rotation of the arc is used alone, the relative velocity between the arc and the gas will be less, so that there may be tendency to have a greater temperature distribution through the product gases.

Even where there is produced magnetic means for rotating the arc, it is believed that some temperature distribution will exist in the gases downstream of the arc, and that this will depend on the material passing through the arc. Calculations of volumetric efficiency and electrical efficiency are thought to show such temperature inhomogeneities which are believed to arise because there are present atoms and ions in a relatively cool gas expanding from the anode aperture. The downstream inhomogeneities are believed to come from areas of recombination downstream in the absence of reactants (i.e. atoms with atom, and ion with electron), and from heats of reaction where atoms react exothermically.

Figure 11:
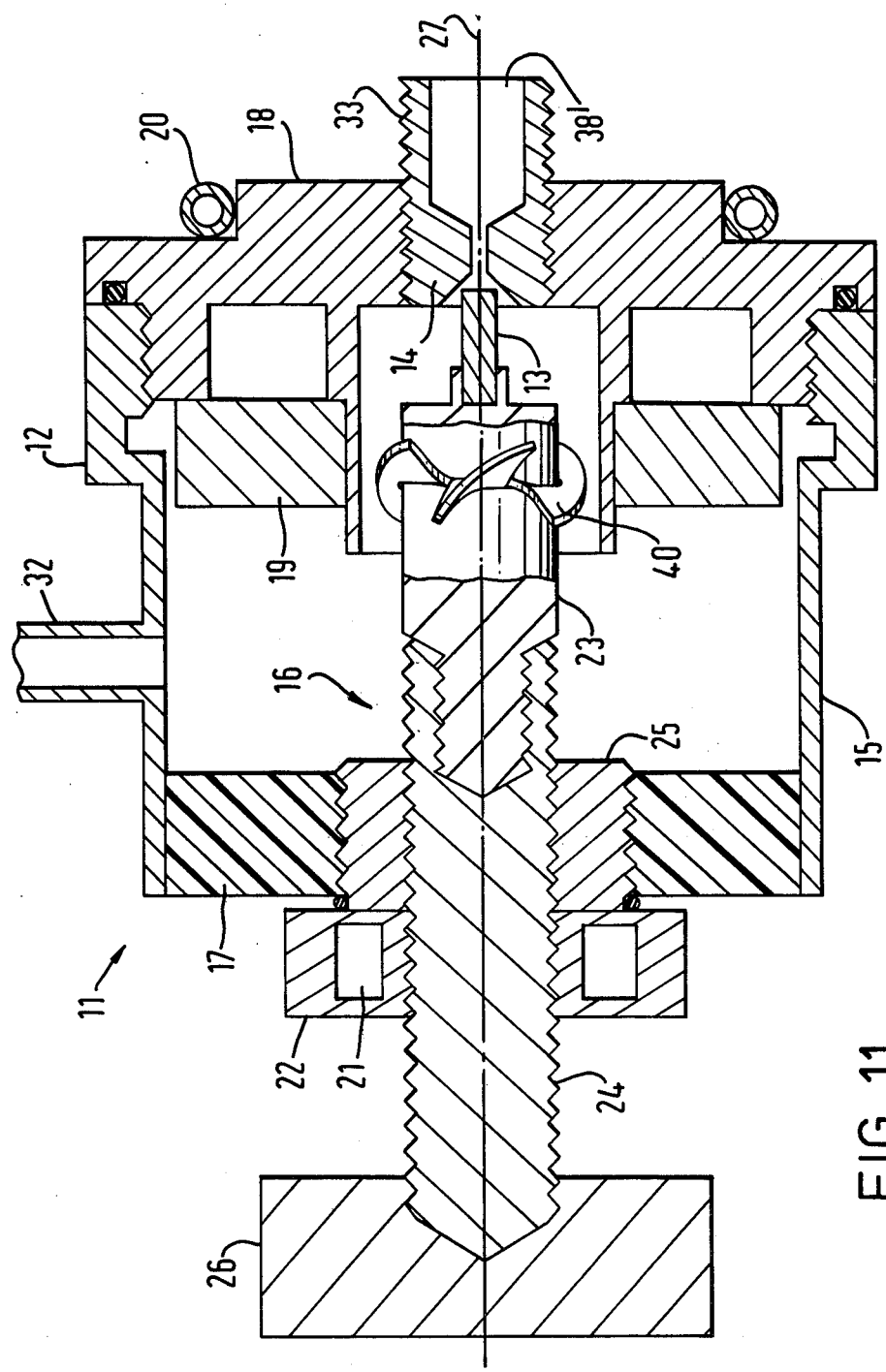
FIG. 11 is a cross-sectional view of a further modification of the apparatus of FIG. 1, including swirl vanes for inducing rotary motion in a gaseous feed stock passing through the apparatus.

It is to be appreciated that the aspect of the invention in which movement of the arc is produced by gas flow is not limited to the use of a tangential input gas flow. The required movement can be obtained by other means which induce swirl in the gaseous medium in which the arc is struck. In FIG. 11 there is shown a modification of the apparatus of FIG. 1 in which arc movement is obtained by use of swirl vanes 40 which act upon the gas flow in the space between the cathode support 23 and the forward part of the anode support 18.

Obviously, numerous modifications and variations of the present invention are possible in light of the above teachings. It is therefore to be understood that within the scope of the amended claims, the invention may be practiced otherwise than as specifically described herein.

What is claimed as new and described to be secured by Letters Patent of the United States is:

1. Apparatus for treating a flow of material by an electric arc comprising:
   a cathode and an anode arranged for striking an arc across a gap between the cathode and the anode and arranged to provide a pathway for flow of material through the gap between the cathode and the anode,
   means for producing movement of the arc around the anode-cathode gap, and
   adjustment means for selectively increasing and decreasing the distance across the anode-cathode gap by rearward and forward axial movement of the cathode for fine control of the internal energy imparted to material passing through the anode-cathode gap,
   the cathode being a substantially non-consumable cathode having an edge at an end thereof opposite the anode for providing a continuous closed path for the cathode root to travel around in operation,
   the anode having an inwardly tapering frusto-conical surface arranged opposite the said edge on the cathode in a position such as to provide on the frusto-conical surface a continuous closed path for the anode spot to travel around in operation,
   the distance across the anode-cathode gap being sufficiently small for the arc channel to be substantially straight between the cathode root and anode spot in normal operation during the said movement of the arc around the gap, and the angles of inclination of the surfaces forming the said edge on the cathode being such relative to each other and relative to the frusto-conical surface of the anode as to prevent the cathode root wandering from the edge along which it is intended to travel during the said movement of the arc around the anode-cathode gap,
   the arrangement being such that the anode spot and cathode root travel around their respective paths in the same sense and in substantially the same time with the arc free from uncontrolled changes in arc length during travel of the anode spot and cathode root around the said respective paths.

2. Apparatus according to claim 1 in which the configuration of the anode and cathode is such that axial movement of the cathode by the said adjustment means produces change in the distance across the anode-cathode gap without change in the geometrical relationship between the arc and the surfaces of the anode and cathode in the region of the anode spot and cathode root, respectively.

3. Apparatus according to claim 1 in which the configuration of the cathode and the anode and the distance across the anode-cathode gap are such that thoughout the movement of the arc around the anode-cathode gap, the arc channel lies substantially at right angles to a tangent to the said edge of the cathode taken at the cathode root.

4. Apparatus according to claim 1 in which the distance across the anode-cathode gap is, in operation, less than 350 microns.

5. Apparatus according to claim 1 in which the distance across the anode-cathode gap lies, in operation, in the range 250 to 350 microns.

6. Apparatus according to claim 1 in which the configuration of the cathode and the anode and the arrangement of the arc moving means are such that in operation the length of the arc remains substantially constant during travel of the anode spot and cathode root around their respective paths.

7. Apparatus according to claim 1, in which the said edge of the cathode is a circular edge.

8. Apparatus according to claim 7 in which the cathode comprises a cylindrical body having, at an end thereof adjacent to the anode, a plane end face perpendicular to a longitudinal axis of the body, the said continuous closed path of the cathode root being provided around the perimeter of the plane end face of the cylindrical body.

9. Apparatus according to claim 7, in which the cathode has a diameter in the range 1 to 55 mm.

10. Apparatus according to claim 1 in which the edge is defined by surfaces leading to each other in the region of the edge at an angle of substantially 90°.

11. Apparatus according to claim 1 in which the said edge which defines the said continuous closed path for the cathode root comprises an edge of a cathode constituted by a solid rod.

12. Apparatus according to any of claims 1 to 6 in which the anode has an aperture through the anode at the inner end of said frusto-conical surface for passage of material which has passed through the said anode-cathode gap.

13. Apparatus according to claim 12 in which the anode is shaped to provide in the region of the cathode an entrance to the aperture having a decreasing cross section and to provide at the other end of the aperture an exit having an increasing cross section, the arrangement being adapted to provide in operation an expansion of material passing out from the anode aperture.

14. Apparatus according to claim 12 in which the anode has a further frusto-conical surface formed on a side of the anode remote from the cathode and coaxial with the aperture through the anode.

15. Apparatus according to claim 14 in which the said further frusto-conical surface has a semi-angle in the range 50° to 70°.

16. Apparatus according to claim 15 in which the said further frusto-conical surface has a semi-angle of substantially 60°.

17. Apparatus according to claim 1 in which the semi-angle of the said frusto-conical surface facing the cathode is in the range of 30° to 50°.

18. Apparatus according to claim 17 in which the semi-angle of the said frusto-conical surface facing the cathode is substantially 45°.

19. Apparatus according to any of claims 1 to 6 in which the arrangement is such that in operation gaseous material passing out from the aperture is subjected to a supersonic expansion.

20. Apparatus according to any of claims 1 to 6 in which the arc moving means is such that in operation the movements of the anode spot and the cathode root around their respective paths are periodic movements.

21. Apparatus according to any of claims 1 to 6 in which the arc moving means comprises means for producing a magnetic field in the region of the cathode-anode gap.

22. Apparatus according to claim 21 in which the magnetic field means is arranged to produce in the region of the cathode-anode gap a magnetic field having a predominant component at right angles to the arc.

23. Apparatus according to claim 21 in which the anode-cathode gap is an annular gap and the magnetic field means comprises an annular magnet coaxial with the said annular gap.

24. Apparatus according to claim 21 in which the said magnetic field means comprises a permanent magnet spaced from the cathode-anode gap, and the magnetic field is focussed to the anode-cathode gap by supporting means for the cathode and/or anode.

25. Apparatus according to claim 24 in which the magnet comprises a permanent annular magnet such as to produce along its axis when situated in air a field in the range 250 to 350 gauss.

26. Apparatus according to any of claims 1 to 6 in which the arc moving means comprises means for inducing in the flow of material through the anode-cathode gap a component of motion generally transverse to the length of the arc.

27. Apparatus according to claim 26 in which the anode-cathode gap is an annular gap and in which the arc moving means comprises means for inducing a flow of material to be treated in a direction generally tangential relative to the axis of the annular gap.

28. Apparatus according to claim 29, in which the anode-cathode gap is an annular gap and in which the said arc moving means comprises swirl vanes for producing a rotary motion in the material to be treated.

29. Apparatus according to any of claims 1 to 6 in which the cathode is formed of thoriated tungsten, tungsten or mild steel, and the anode is formed of brass, copper or silver.

30. Apparatus according to any of claims 1 to 6 including means for supplying across the anode-cathode gap during normal continuous operation of the apparatus a potential difference in the range 40 to 120 volts.

31. Apparatus according to any of claims 1 to 6 including means for supplying across the anode-cathode gap a potential difference such that in operation the passage of current across the gap by means of the arc during normal continuous operation consumes a power in the range 400 to 1500 watts.

32. Apparatus according to any of claims 1 to 6 including means for producing a flow of the said material through the anode-cathode gap at a flow rate in the range 60 to 500 ml/s.

33. Apparatus according to any of claims 1 to 6 including a housing providing a pressure chamber for receiving under pressure the material to pass through the cathode-anode gap, the apparatus having an inlet for supplying material under pressure to the pressure chamber, and an outlet for passage of material out from the region of the anode-cathode gap after the material has passed through said gap and has been treated by the arc.

34. Apparatus according to any of claim 1 to 6 in which the apparatus is adapted to pass the said material through the anode-cathode gap in a gaseous form.

35. A method of treating a flow of material by an electric arc, comprising:
passing a flow of material through a gap between a substantially non-consumable cathode having an edge for striking the arc and an anode having an inwardly tapering frusto-conical surface positioned opposite the edge of the cathode, the angles of inclination of the surfaces forming the said edge of the cathode being arranged to be such relative to each other and relative to the frusto-conical surface of the anode as to prevent the cathode root wandering from the said edge during normal operation,
striking an arc across the anode-cathode gap between the edge of the cathode and the frusto-conical surface of the anode,
selectively increasing and decreasing the distance across the anode-cathode gap by axial movement of the cathode to control the internal energy imparted to the material passing through the anode-cathode gap and adjusting the cathode to a position in which the distance across the anode-cathode gap is sufficiently small for the arc channel to be substantially straight between the cathode root and anode spot during normal operation, and
producing movement of the arc around the anode-cathode gap such that the cathode root travels along a continuous closed path around the said edge of the cathode and the anode spot travels along a continuous closed path around the said frusto-conical surface, and the cathode root and anode spot travel around their respective paths in the same sense and in substantially the same time with the arc free from uncontrolled changes in arc length during the travel of the anode spot and the cathode root.

36. A method according to claim 35 including varying the anode-cathode gap by producing changes in the distance across the anode-cathode gap without change in the geometrical relationship between the arc and the surfaces of the anode and cathode in the region of the anode spot and cathode root respectively.

37. A method according to claim 35 including striking the arc in such a manner that throughout the movement of the arc around the anode-cathode gap, the arc channel lies substantially at right angles to a tangent to the edge of the cathode taken at the cathode root.

38. A method according to claim 35 including striking the arc across an anode-cathode gap having a distance less than 350 microns across the gap.

39. A method according to claim 35 including striking the arc across an anode-cathode gap having a distance across the gap lying in the range 250 to 350 microns.

40. A method according to claim 35 in which the length of the arc is kept substantially constant during travel of the anode spot and cathode root around their respective paths.

41. A method according to claim 35 in which the said edge of the cathode is a circular edge.

42. A method according to claim 35 including the step of striking the arc at an edge defined by surfaces leading to each other in the region of the edge at an angle of substantially 90°.

43. A method according to any of claims 35 to 37 including the step of causing the cathode root to travel along its said continuous closed path around the perimeter of a plane end face of a cylindrical body forming the cathode, the plane end face being perpendicular to the longitudinal axis of the cylindrical body.

44. A method according to any of claims 35 to 39 including the step of arranging the anode-cathode gap as an annular gap and causing the material passing through the anode-cathode gap to pass subsequently through an aperture through the anode coaxial with the annular gap.

45. A method according to claim 44 including the step of causing the material passing through the anode-cathode gap to pass through an entrance to the anode aperture having a decreasing cross section and through an exit from the anode aperture having an increasing cross section, in such a manner as to cause an expansion of the material passing out from the anode aperture.

46. A method according to claim 45 including the step of causing a gaseous material passing out from the aperture to be subjected to a supersonic expansion.

47. A method according to any of claims 35 to 39 including the step of varying the said cathode-anode gap in order to impart to the material passing through the gap a required internal energy to produce a required treatment of material in a subsequent downstream reaction.

48. A method according to any of claims 35 to 39 including the steps of moving the anode spot around its closed continuous path in a periodic movement, and moving the cathode root around its closed continuous path in a periodic movement.

49. A method according to any of claims 35 to 39 including the step of producing movement of the arc by producing a magnetic field in the region of the cathode-anode gap.

50. A method according to claim 49 including the step of producing in the region of the cathode-anode gap a magnetic field having a predominant component at right angles to the arc.

51. A method according to any of claims 35 to 39 including the step of producing movement of the arc by inducing in the flow of material through the anode-cathode gap a component of motion generally transverse to the length of the arc.

52. A method according to claim 51 including the steps of arranging the anode-cathode gap as an annular gap and inducing a flow of material to be treated in a direction generally tangential relative to the axis of the annular gap.

53. A method according to claim 51 including the steps of arranging the anode-cathode gap as an annular gap and passing the material to be treated through swirl vanes for producing a rotary motion in the material to be treated.

54. Apparatus for treating a flow of material by an electric arc comprising:

a cathode and an anode arranged for striking an arc across a gap between the cathode and the anode and arranged to provide a pathway for flow of material through the gap between the cathode and the anode, means for maintaining the arc by supplying across the anode-cathode gap a potential difference in the range 40 to 120 volts with a power consumption in operation in the range 400 to 1500 watts, means for producing movement of the arc around the anode-cathode gap, and adjusting means for selectively increasing and decreasing the distance across the anode-cathode gap without change in the geometrical relationship between the arc and the surfaces of the anode and cathode by rearward and forward axial movement of the cathode for fine control of the internal energy imparted to the material passing through the anode-cathode gap, the cathode being a substantially non-consumable cathode having an average width in the range 1 to 5 mm and having an edge at an end thereof opposite the anode for providing a continuous closed path for the cathode root to travel around in operation, the anode having an inwardly tapering frusto-conical surface arranged opposite the said edge on the cathode in a position such as to provide on the frusto-conical surface a continuous closed path for the anode spot to travel around in operation, the distance across the anode cathode gap lying in the range 250 to 350 microns and being sufficiently small for the arc channel to be substantially straight between the cathode root and anode spot in normal operation during the said movement of the arc around the gap, the said frusto-conical surface of the anode having a semi-angle in the range 30° to 50° and the angles of inclination of the surfaces forming the said edge on the cathode being such relative to each other and relative to the frusto-conical surface of the anode as to prevent the cathode root wandering from the edge along which it is intended to travel during the said movement of the arc around the anode cathode gap, the arrangement being such that the anode spot and cathode root travel around their respective paths in the same sense and in substantially the same time with the arc free from uncontrolled changes in arc length during travel of the anode spot and cathode root around the said respective paths.

55. Apparatus for treating a flow of material by an electric arc comprising:

a cathode and an anode arranged for striking an arc across a gap between the cathode and the anode and arranged to provide a pathway for flow of material through the gap between the cathode and the anode, means for producing movement of the arc around the anode cathode gap, and adjustment means for selectively increasing and decreasing the distance across the anode cathode gap without change in the geometrical relationship between the arc and the surfaces of the anode and cathode by rearward and forward axial movement of the cathode for fine control of the internal energy imparted to material passing through the anode cathode gap, the cathode being a substantially non-consumable cathode having a circular edge at an end thereof opposite the anode for providing a continuous closed path for the cathode root to travel around in operation, the anode having an inwardly tapering frusto-conical surface arranged coaxially with and opposite to the said circular edge on the cathode in a position such as to provide on the frusto-conical surface a continuous closed circular path for the anode spot to travel around in operation, the distance across the anode cathode gap being sufficiently small for the arc channel to be substantially straight between the cathode root and anode spot in normal operation during the said movement of the arc around the gap, with the arc channel lying substantially at right-angles to a tangent to the said edge of the cathode taken at the cathode root, and at right-angles to the frusto-conical surface of the anode, the said circular edge being defined by a right circular cylindrical outer surface of the cathode meeting a plane end surface of the cathode at right-angles to the plane end surface, and the said frusto-conical surface of the anode being coaxial with the cylindrical cathode and having a semi-angle of 45°, whereby the angles of the inclination of the surfaces forming the said edge on the cathode are such relative to each other and relative to the frusto-conical surface of anode so as to prevent the cathode root wandering from the edge along which it is intended to travel during the said movement of the art around the anode cathode gap, the arrangement being such that the anode spot and cathode root travel together around their respective paths with the arc length substantially constant during the travel of the anode spot and cathode root.

56. A method of treating a flow of material by an electric arc, comprising:

passing a flow of material through a gap between a substantially non-consumable cathode and an anode having an inwardly tapering frusto-conical surface of semi-angle in the range 30° to 50° positioned opposite the end of the cathode, striking across the anode-cathode gap between an edge of the cathode and the frusto-conical surface of the anode an arc which is substantially straight between the cathode root and anode spot, the angles of inclination of the surfaces forming the said edge on the cathode being arranged to be such relative to each other and relative to the frusto-conical surface of the anode as to prevent the cathode root wandering from the said edge during normal operation, maintaining the arc during normal operation by supplying across the anode-cathode gap a potential difference in the range 40 to 120 volts with a power consumption in the range 400 to 1500 watts, producing movement of the arc around the anode-cathode gap such that the cathode root travels along a continuous closed path around the said edge of the cathode and the anode spot travels along a continuous closed path around the said frusto-conical surface, and the cathode root and anode spot travel around their respective paths in the same sense and in substantially the same time with the arc free from uncontrolled changes in arc length during the travel of the anode spot and cathode root, and selectively increasing and decreasing the distance across the anode-cathode gap without change in the geometrical relationship between the arc and the surfaces of the anode and cathode by rearward and forward axial movement of the cathode to control the internal energy imparted to the material passing through the anode-cathode gap, the distance across the anode-cathode gap being adjusted so as to lie in the range 250 to 350 microns in normal operation.

57. A method of treating a flow of material by an electric arc, comprising:

passing a flow of material through a gap between a substantially non-consumable cathode having a circular edge for striking the arc and an anode having an inwardly tapering frusto-conical surface positioned coaxially with and opposite to the edge of the cathode, the said circular edge being defined by a right circular cylindrical outer surface of the cathode meeting a plane end surface of the cathode at right angles to the plane end surface, and the said frusto-conical surface of the anode being coaxial with the cylindrical cathode and having a semi-angle of 45°, whereby the angles of inclination of the surfaces forming the said edge on the cathode are arranged to be such relative to each other and relative to the frusto-conical surface of the anode as to prevent the cathode root wandering from the said edge during normal operation, striking across the anode-cathode gap between the edge of the cathode and the frusto-conical surface of the anode an arc which is substantially straight between the cathode root and anode spot during normal operation and which lies substantially at right-angles to a tangent to the said edge of the cathode taken at the cathode root and at right-angles to the frusto-conical surface of the anode, producing movement of the arc around the anode-cathode gap such that the cathode root travels along a continuous closed circular path around the said edge of the cathode and the anode spot travels along a continuous closed circular path around the said frusto-conical surface, and the cathode root and anode spot travel around their respective paths in the same sense and in substantially the same time with the arc length substantially constant during the travel of the anode spot and cathode root, and selectively increasing and decreasing the distance across the anode-cathode gap without change in the geometrical relationship between the arc and the surfaces of the anode and cathode by rearward and forward axial movement of the cathode to control the internal energy imparted to the material passing through the anode-cathode gap.

* * * * *